(12) United States Patent
Song

(10) Patent No.: US 9,054,267 B2
(45) Date of Patent: Jun. 9, 2015

(54) METHOD OF MANUFACTURING LIGHT ABSORBING LAYER FOR SOLAR CELL USING SELENIZATION PROCESS UNDER ELEMENT SELENIUM VAPOR AMBIENCE AND THERMAL TREATMENT APPARATUS FOR MANUFACTURING LIGHT ABSORBING LAYER

(71) Applicant: SEMICS INC., Seongnam-si (KR)

(72) Inventor: Seong Hoon Song, Seoul (KR)

(73) Assignee: SEMICS INC. (KR)

( * ) Notice: Subject to any disclaimer, the term of this patent is extended or adjusted under 35 U.S.C. 154(b) by 0 days.

(21) Appl. No.: 14/514,691

(22) Filed: Oct. 15, 2014

(65) Prior Publication Data

US 2015/0031166 A1 Jan. 29, 2015

Related U.S. Application Data

(62) Division of application No. 14/114,967, filed as application No. PCT/KR2011/005727 on Aug. 4, 2011.

(30) Foreign Application Priority Data

May 31, 2011 (KR) .................. 10-2011-0052459

(51) Int. Cl.
*H01L 21/00* (2006.01)
*H01L 31/18* (2006.01)
*H01L 31/032* (2006.01)

(52) U.S. Cl.
CPC ............ *H01L 31/18* (2013.01); *H01L 31/0322* (2013.01)

(58) Field of Classification Search
None
See application file for complete search history.

(56) References Cited

U.S. PATENT DOCUMENTS

| 4,523,051 A | 6/1985 | Mickelsen et al. |
| 4,798,660 A | 1/1989 | Ermer et al. |
| 5,141,564 A | 8/1992 | Chen et al. |
| 7,194,197 B1 * | 3/2007 | Wendt et al. ................. 392/389 |
| 2010/0311202 A1 | 12/2010 | Hakuma et al. |
| 2012/0009728 A1 * | 1/2012 | Li .................................. 438/89 |
| 2012/0190180 A1 * | 7/2012 | LoBue et al. ................. 438/486 |

FOREIGN PATENT DOCUMENTS

| JP | 2009135299 | 6/2009 |
| KR | 1020020007777 | 1/2002 |
| KR | 1020100105097 | 9/2010 |

OTHER PUBLICATIONS

International Search Report—PCT/KR2011/005727 dated Apr. 19, 2012.

* cited by examiner

*Primary Examiner* — Charles Garber
*Assistant Examiner* — Abdulfattah Mustapha
(74) *Attorney, Agent, or Firm* — Cantor Colburn LLP

(57) ABSTRACT

A method of manufacturing a light absorbing layer for a solar cell by performing thermal treatment on a specimen configured to include thin films of one or more of copper, indium, and gallium on a substrate and element selenium, includes steps of: heating a wall of a chamber up to a predefined thin film formation temperature in order to maintain a selenium vapor pressure; mounting the specimen and the element selenium on the susceptor at the room temperature and loading the susceptor in the chamber; and heating the specimen in the lower portion of the susceptor and, at the same time, heating the element selenium in the upper portion of the susceptor.

5 Claims, 13 Drawing Sheets

(a)

(b)

(c)

(a)

(b)

METHOD OF MANUFACTURING LIGHT ABSORBING LAYER FOR SOLAR CELL USING SELENIZATION PROCESS UNDER ELEMENT SELENIUM VAPOR AMBIENCE AND THERMAL TREATMENT APPARATUS FOR MANUFACTURING LIGHT ABSORBING LAYER

CROSS REFERENCE TO RELATED APPLICATIONS

This application is a divisional of U.S. Ser. No. 14/114,967, filed on Oct. 31, 2013, which is a national entry of PCT Application No. PCT/KR2011/005727 filed on Aug. 4, 2011, which claims priority to and the benefit of Korean Application No. 10-2011-0052459 filed on May 31, 2011 in the Korean Intellectual Property Office, the entire contents of which are incorporated herein by reference.

TECHNICAL FIELD

The present invention relates to a method of manufacturing a light absorbing layer for a solar cell and a thermal treatment apparatus for manufacturing a light absorbing layer for a solar cell, and more particularly, a method of manufacturing a light absorbing layer for a solar cell using a selenization process capable of manufacturing a high-efficiency, large-area CIGS light absorbing layer in a short time by performing thermal treatment under an element selenium vapor ambience and a thermal treatment apparatus for manufacturing a light absorbing layer for a solar cell, which is suitable for implementing the method.

BACKGROUND ART

At recent, a ternary thin film such as $CuInSe_2$ (hereinafter, referred to as 'CIS') or $CuIn_{1-x}Ga_xSe_2$ (hereinafter, referred to as 'CIGS') as one of compound semiconductor has been actively researched. Unlike silicon solar cells in the related art, the CIS-based thin film solar cells can be manufactured with a thickness of 10 microns or less and have stable characteristics in long-term use. In addition, according to experiments, maximum conversion efficiency thereof is 19% which is far superior to other solar cells, so that the CIS-based thin film solar cells can be highly expected to be commercialized as low-cost, high-efficiency solar cells as a substitute for silicon solar cells.

Accordingly, as a representative method of manufacturing a CIGS thin-film, there are a co-evaporation method, a selenization method of injecting copper, indium, and gallium on a specimen and performing annealing using $H_2Se$ or element selenium.

As disclosed in U.S. Pat. No. 4,523,051, in a co-evaporation method, metal elements are simultaneously evaporated and deposited under a vacuum ambience. Although high efficiency of 20% is obtained in the laboratory, the aforementioned co-evaporation method has problems of low material utilization and high cost apparatuses, difficulties in large-area deposition, relatively low throughput, and the like, which are to overcome for commercialization thereof.

As disclosed in U.S. Pat. No. 4,798,660 or 5,141,564, in a selenization method using annealing, the CIGS thin-film is formed by performing thermal treatment on a substrate on which CIG, ICG, and CGI thin films are formed under an $H_2Se$ or element selenium vapor ambience. Among these type methods, a method using annealing under an ambience of selenium containing gas such as $H_2Se$, a method of depositing selenium on a specimen where copper, indium, gallium, and the like is coated and heating to allow selenium to react in a liquid phase, and the like are expected to be commercialized in the near future. In the method of depositing selenium on a specimen where copper, indium, gallium, and the like is coated and heating, during a thermal treatment process, the selenium coated or deposited on the uppermost layer is liquefied, and the liquefied selenium reacts with copper, indium, gallium to generate the CIGS thin film. Due to much higher density of element selenium than that of a gas, the reaction time can be shortened and high-quality CIGS can be obtained. Therefore, several companies have adopted the aforementioned method in mass production. The core of this process is to minimize evaporation of liquefied selenium before the reaction of liquefied selenium, to maintain selenium vapor pressure during the reaction, and to maintain uniform reaction to prevent bowling dewetting, or the like. However, in order to solve problems of surface tension due to viscosity of liquefied selenium, non-uniform evaporation due to inevitable non-uniformity of temperature, damage to molybdenum electrode due to diffusion of liquefied selenium into a molybdenum electrode, and the like, a temperature of a thermal treatment process, evaporation flux, and other complex factors needs to be very accurately controlled. Thus, the above-mentioned methods have technical difficulty in commercialization. If a method which does not depend on the reaction of liquefied selenium is contrived, the aforementioned problems may be solved more easily and economically.

On the other hand, as a method capable of avoiding the reaction of liquefied selenium and increasing the selenium vapor pressure, in a method in the related art illustrated in FIG. 1 where RTP is performed under a $H_2Se$ or dimetyl selenium vapor ambience, an ambience of a relatively high pressure of 1/50 atm or more can be easily maintained, so that reactivity can be improved. Therefore, the method has been adopted in mass production. However, the method has problems of high cost and toxicity of reaction gases to be solved.

As one of selenization methods using annealing, a method in the related art illustrated in FIG. 2, where element selenium and a specimen where copper, indium, and gallium thin films are deposited on an electrode are simultaneously heated and, after that, selenium vapor is supplied to generate a light absorbing layer, is very economical, but the method is not suitable for obtaining high efficiency.

The aforementioned methods have been tried so far due to many advantages of low cost manufacturing, convenience of processes, and non-toxicity which are useful for commercialization and for the purpose of researches preceding researches for other methods or researches for CIGS reaction mechanism. However, there is no report of achievement of manufacturing of solar cells having high efficiency of about 10% through the aforementioned methods. If a method capable of obtaining high efficiency is contrived, the method will be a new method suitable for mass production of CIGS solar cells.

On the other hand, in the method illustrated in FIG. 2, where element selenium and a specimen are deposited on a CIG/CI thin film electrode are simultaneously heated and, after that, selenium vapor is supplied to generate a light absorbing layer, the selenium vapor pressure in the chamber cannot be controlled to be sufficiently high, so that high efficiency cannot be obtained. Thus, if a sufficient density of selenium in the chamber can be maintained, the selenization method using an element selenium vapor may be adapted to easily obtain large area, high efficiency, and high productivity.

SUMMARY OF THE INVENTION

The present invention is contrived in order to solve the problems of a decrease in selenium vapor pressure, condensation of liquefied selenium on a specimen, and non-uniformity of selenium vapor pressure occurring in the method where CIG, ICG, and CGI thin films are deposited on a specimen and, after that, heating is performed under an element selenium vapor ambience. The present invention is to provide a method of manufacturing a high efficiency CIGS light absorbing layer and a technical solution for reducing production cost of CIGS light absorbing layer, obtaining high productivity and convenience in manufacturing processes, and easily implementing wide area, so that the CIGS solar cells can be successfully commercialized through the method.

According to a first aspect of the present invention, there is provided a method of manufacturing a light absorbing layer for a solar cell by performing thermal treatment on a specimen configured to include thin films of one or two or more of copper, indium, and gallium on a substrate and element selenium, including steps of: (a) heating all wall of a sealed chamber up to a predefined thin film formation temperature in order to maintain a selenium vapor pressure so that the selenium is not condensed on all the wall of the chamber; (b) mounting the specimen and the element selenium on the susceptor at the room temperature and loading the susceptor in the chamber; and (c) heating the specimen in the lower portion of the susceptor and, at the same time, heating the element selenium in the upper portion of the susceptor, wherein, in the step (c), in order for liquefied selenium not to be condensed on the specimen which is loaded at the room temperature and is not yet heated, the temperature of the element selenium loaded in the chamber and the temperature of the specimen loaded in the chamber are individually controlled, so that the selenium vapor pressure of an inner space of the chamber due to evaporation of the element selenium does not exceed a vapor pressure corresponding to the temperature of the specimen.

In the method according to the first aspect, it is preferable that the susceptor is configured to include a specimen mounting plate on which the specimen is mounted and a source material mounting plate on which the source material is mounted, the source material mounting plate is fixed to the upper portion of the specimen mounting plate, and in the source material mounting plate, a plurality of holes penetrating upper and lower surfaces of the source material mounting plate and a plurality of depressed portions for mounting the source material on the upper surface of the source material mounting plate are uniformly arranged, so that the selenium is designed to be disposed at the positions separated from the upper surface of the specimen and the selenium is uniformly supplied to the upper surface of the specimen.

In addition, in the method according to the first aspect, it is preferable that one or two of sulfur(S) and a compound containing Na as well as the element selenium is further mounted on the susceptor.

According to a second aspect of the present invention, there is provided a thermal treatment apparatus for manufacturing a light absorbing layer for a solar cell, where thermal treatment can be performed on a specimen, including: a susceptor configured to include a source material mounting plate on which element selenium is mounted and a specimen mounting plate which the specimen including thin films of at least one or more of copper, indium, and gallium on a substrate is mounted; a main chamber configured to have a dual-chamber structure including a first chamber and a second chamber disposed inside the first chamber and to allow the susceptor to be loaded in the second chamber; a buffer chamber configured to be connected to main chamber to load the susceptor mounted on a state into the second chamber of the main chamber or to unload the susceptor from the second chamber by using a robot arm; and a control module configured to control operations of the main chamber and operations of the buffer chamber, wherein the control module allows all the wall of the sealed chamber to be heated up to a predefined thin film formation temperature so that the selenium is not condensed on all the wall of the second chamber in order to maintain a selenium vapor pressure, allows the specimen and the element selenium to be mounted on the susceptor at the room temperature, allows the susceptor to be loaded in the second chamber, allows the specimen in the lower portion of the susceptor to be thermally treated, and at the same time, allows the element selenium in the upper portion of the susceptor to be heated.

In the method according to the first aspect, in order for the liquefied selenium not to be condensed on the specimen which is loaded at the room temperature and is not yet heated, the control module individually controls the temperature of the element selenium loaded in the chamber and the temperature of the specimen loaded in the chamber, so that the selenium vapor pressure in the vicinity of the specimen due to the evaporation of the element selenium does not exceed the vapor pressure corresponding to the temperature of the specimen.

According to a third aspect of the present invention, there is provided a method of manufacturing a light absorbing layer for a solar cell, including steps of: loading a specimen of which copper, indium, and gallium are deposited in the second chamber of which the wall is heated up to a temperature near the CIGS formation temperature and, at the same time, mounting materials including selenium and one or two of sulfur(S) and a compound containing Na for selenization; and heating the specimen and the materials by using a heat source such as a halogen lamp, so that a CIGS light absorbing layer is manufactured.

According to the present invention, it is possible to provide a high efficiency CIGS method of manufacturing a light absorbing layer through a method where CIG/CI thin films are formed on an electrode and, after that, thermal treatment is performed under an element selenium vapor ambience and to provide a technical solution for reducing production cost of the CIGS light absorbing layer, obtaining high productivity and convenience of manufacturing processes, and easily implementing high area, so that it is possible to obtain an advantage of successfully commercialize CIGS solar cells through the method.

DETAILED DESCRIPTION OF THE INVENTION

In a method where element selenium and a specimen where CIG/CI thin films are deposited on an electrode and simultaneously heated and, after that, selenium vapor is supplied to generate a light absorbing layer, reasons for the above-described problems are as follows.

Figure 1:
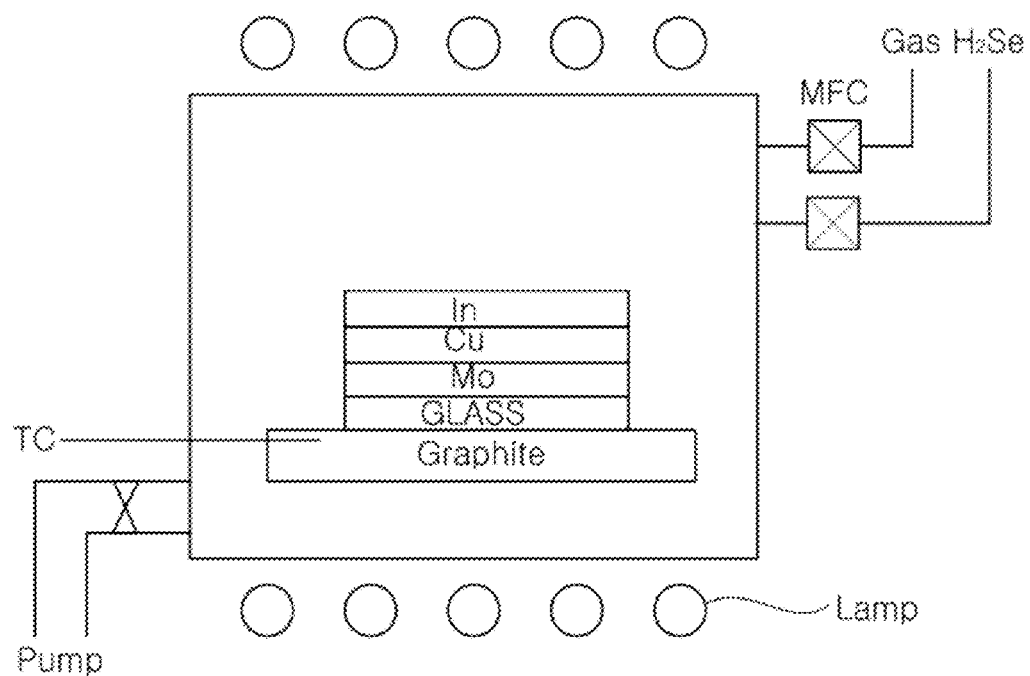
FIG. 1 is a schematic cross-sectional diagram illustrating a method of generating a light absorbing layer by annealing a hydrogen selenide ($H_2Se$) and a specimen in a chamber according to a method a selenization process in the related
Figure 2:
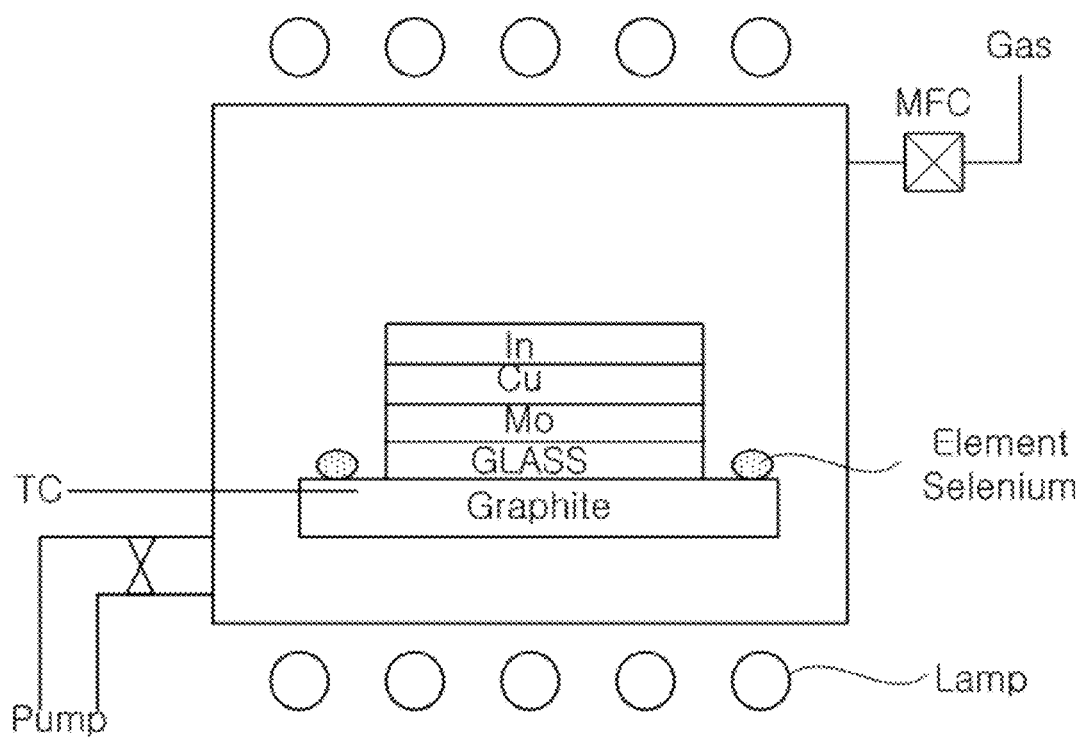
FIG. 2 is a schematic cross-sectional diagram illustrating a method of generating a light absorbing layer by annealing selenium and a specimen where copper, indium, and gallium are deposited in a chamber to supply evaporated selenium on a surface of the specimen according to a method a selenization process in the related

1. In the method in the related art, a temperature of the entire wall of a chamber is not controlled, or the temperature is not sufficiently controlled, so that a sufficient selenium vapor pressure in the chamber cannot be maintained. For example, when the light absorbing layer is manufactured at 550° C., if a temperature of at least a portion of an outer wall becomes 450° C. or less, selenium is allowed to be evaporated in order to maintain an inner-chamber vapor pressure to be a selenium vapor pressure corresponding to 450° C., that is, about 1/100 atm or more. However, since the selenium vapor is condensed at a portion of 450° C. or less, although selenium is to be evaporated at the higher temperature, the selenium vapor ambience of about 1/100 atm or more cannot be maintained. On the other hand, if the temperature of all the portions of inner and outer wall of the chamber is maintained to be 550° C. or more, a sufficiently large amount of selenium (sufficiently large in comparison with a volume of the chamber) can be evaporated at a sufficiently high temperature, so that the inner-chamber vapor pressure can be maintained to be a selenium vapor pressure corresponding to 550° C., that is, about 1/10 atm. However, actually, in the case where heating is performed under the chamber conditions illustrated in FIG. 2, due to a difference in thermal capacity between the outer wall and selenium, the temperature of the specimen and the temperature of the selenium are rapidly increased, but the temperature of the outer wall is slowly increased. Therefore, liquefied selenium is condensed on the wall of the chamber. As a result, the selenium vapor pressure in the vicinity of the specimen is remarkably decreased. Accordingly, the CIGS light absorbing layer is formed under an insufficient selenium vapor pressure, so that a high-quality light absorbing layer cannot be obtained. FIG. 2 is a cross-sectional diagram illustrating a method of manufacturing a light absorbing layer in the related art.

2. In the case where a specimen and selenium are simultaneously heated in a chamber, due to a difference in thermal capacity between the specimen and the selenium, the temperature of the selenium is rapidly increased, but the temperature of the specimen is slowly increased in comparison to the temperature of the selenium. Therefore, the selenium is condensed on a surface of the specimen. The condensation of selenium leads to serious side effects to a CIGS formation reaction.

3. In the case where element selenium is distributed around the specimen, as the size of the specimen is increased, the middle region of the specimen is away from the selenium, and the outer region of the specimen is close to the selenium. In this manner, the regions of the specimen are not uniformly separated from the selenium, it is difficult to allow the selenium to uniformly react with the entire specimen. In addition, it is well known that, due to the property of coexistence of $Se_2$, $Se_8$, or a cluster form of molecular structure of selenium, the selenium in a gas state is not uniformly distributed.

The reasons for the above-described problems are analyzed, and the method of manufacturing a light absorbing layer for a solar cell according to the present invention will be described in detailed with reference the attached drawings.

Figure 4:
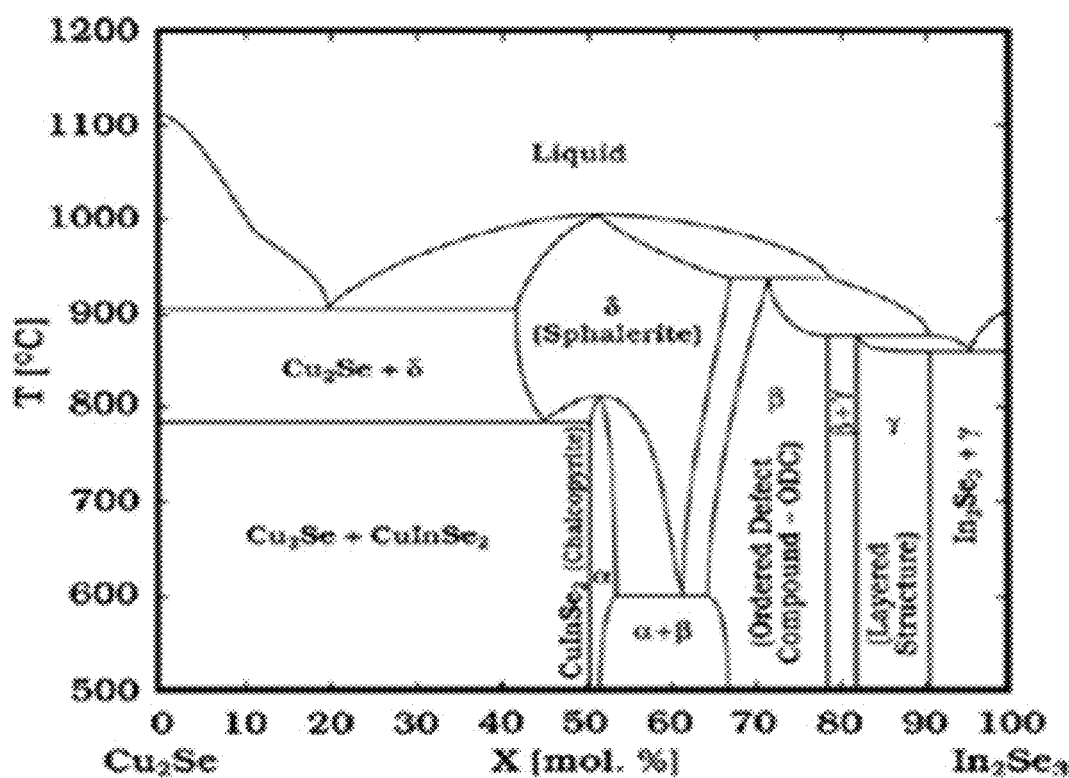
FIG. 4 is a phase diagram illustrating a change in phase of a specimen mixed with copper and indium in a reaction under a sufficient selenium vapor pressure.

In general, if copper and indium are mixed and reaction is performed under a sufficient selenium vapor pressure, a phase diagram illustrated in FIG. 4 is obtained. It is can be understood from the phase diagram that, in order to obtain a phase CIGS crystal required for the light absorbing layer for a solar cell, a sufficient selenium vapor pressure and conditions of copper indium equivalence ratio and temperature in the range illustrated in the phase diagram are needed. However, in the case where the specimen is heated through a method other than the co-evaporation method, the heating needs to be started at the room temperature technically, so that the time to reach optimum CIGS formation temperature, that is, about 550° C. from the room temperature may be be delayed. In this manner, if the CIGS formation is delayed, other phase materials which are hard to decompose rather than the alpha phase CIGS are made as illustrated in the phase diagram. Therefore, the specimen needs to be heated up to the CIGS formation temperature as speedily as possible. In addition, since the phase diagram illustrated in FIG. 4 is obtained on the condition of a sufficient selenium vapor pressure, if the selenium vapor pressure is not sufficient, other materials rather than the materials illustrated in FIG. 4 may be made. Even if the α phase material is made, selenium vacancy exists in the light absorbing layer, so that a concentration of holes in the finally-generated light absorbing layer is decreased.

In order to implement optimum chamber conditions for an ideal thermal treatment process, it is important to secure temperature uniformity of all the portions in the sealed chamber around the CIGS formation temperature and to maintain a sufficient selenium vapor pressure so that selenium cannot be condensed on any portions in the chamber.

TABLE 1

| P (Pa) | 1 | 10 | 100 | 1 k | 10 k | 100 k |
|---|---|---|---|---|---|---|
| at T(K) | 500 | 552 | 617 | 704 | 813 | 958 |

In a specific method, temperature uniformity of all the portions in the sealed chamber is secured to be 540° C. around the CIGS formation temperature, and the selenium is not allowed to be condensed on any portions in the chamber while the selenium vapor pressure corresponding to 540° C. is maintained. In other words, as listed in Table 1, when the all the portions in the chamber is at 540° C. (813 K), the selenium vapor pressure becomes 10 kPa (1/10 atm). When selenium is inserted into the chamber around 1/10 atm in the state of complete evaporation, the selenium is not condensed on the wall of the chamber in spite of the complete evaporation. However, if any portion of the chamber is at 431° C. (704 K), the selenium is condensed on the portion, so that the inner-chamber selenium vapor pressure of 10 kPa (1/10 atm) cannot be maintained.

It is also important to prevent selenium condensation on the specimen in addition to the selenium condensation on the outer wall of the chamber.

Figure 5:
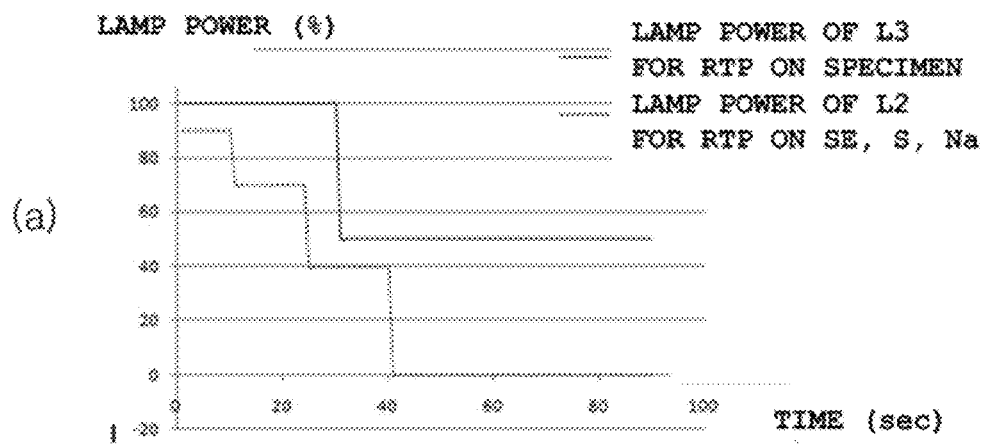
FIG. 5 are diagrams illustrating (a) a graph of an intensity of a heat source such as a halogen lamp for thermally treating a specimen and selenium, (b) a graph of a change in temperature of the specimen according to time, and (c) a saturation vapor pressure and a selenium vapor pressure in the vicinity of the specimen according to time and a temperature of the specimen in the manufacturing method according to the exemplary embodiment of the present invention, respectively.
Figure 5:
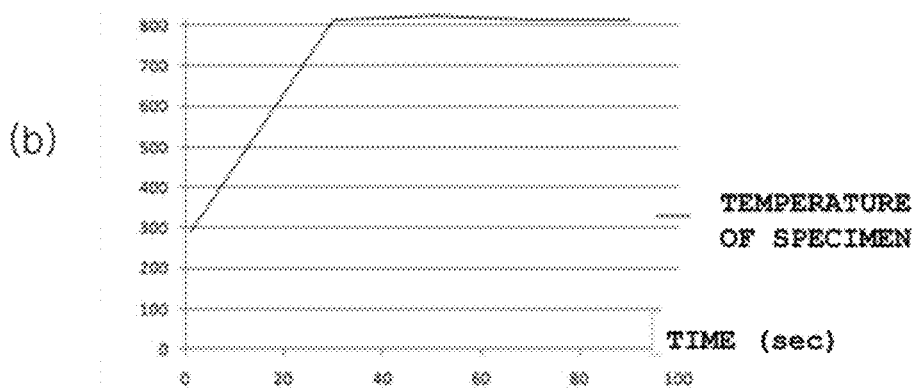
Figure 5:
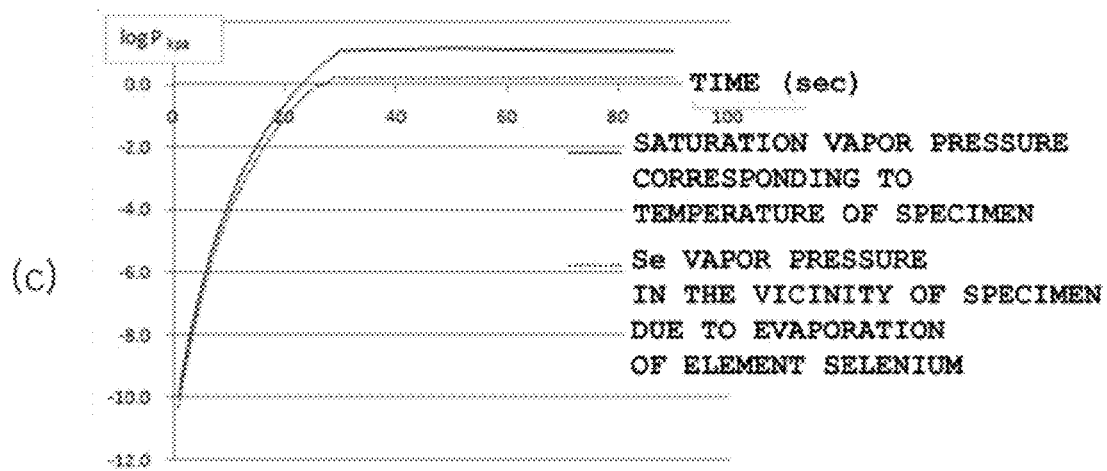

As described above, after the optimum conditions for thermal treatment in the sealed chamber is secured, the specimen, selenium, and one or two of sulfur(S) and a compound containing Na are simultaneously heated. In the case, it is important that the temperature of the element selenium and the temperature of the specimen is individually controlled so that the selenium vapor pressure in the vicinity of the specimen does not exceed the vapor pressure corresponding to the temperature of the specimen due to the evaporation of the element selenium, so that liquefied selenium cannot be condensed on the surface of the specimen during the thermal treatment. If the liquefied selenium is condensed on the surface of the specimen during the thermal treatment, problems of surface tension due to viscosity of the liquefied selenium, non-uniform evaporation due to inevitable non-uniformity of temperature, damage to molybdenum electrode due to diffusion of the liquefied selenium into a molybdenum electrode, and the like may occur. Therefore, the temperature of the specimen is controlled by using the third heat source, and the temperature of the selenium and one or two of sulfur(S) and a compound containing Na is controlled by using the third heat source. It is important to individually control the temperature of the specimen and the temperature of the selenium and one or two of sulfur(S) and a compound containing Na so that the liquefied selenium is not allowed to be condensed on the surface of the specimen during the thermal treatment. In order to achieve the aforementioned object, as illustrated in FIGS. 5(a), 5(b), and 5(c), the power and time of each of the second and third heat sources need to be systematically controlled. FIGS. 5(a), 5(b) and 5(c) are diagrams illustrating a graph of an intensity of a heat source such as a halogen lamp for thermally treating a specimen and selenium, a graph of a change in temperature of the specimen according to time, and a vapor pressure and a selenium vapor pressure in the vicinity of the specimen according to time and a temperature of the specimen in the manufacturing method according to the exemplary embodiment of the present invention, respectively. Referring to FIGS. 5(a), 5(b), and 5(c), the power and time of the third heat source is controlled to be 100% (30 seconds)->50% (60 seconds), and the power and time of the second heat source is controlled to be 90% (10 seconds)->70% (20 seconds)->40% (10 seconds). The vapor pressure is a function of temperature, and the evaporation amount is proportional to a product of an exposed area of a source material and a vapor pressure. As described above, the power and time of each of the second and third heat sources are systematically controlled, and the temperature of the specimen is controlled. If the size of the groove of the susceptor on which the source material is loaded is well defined, as illustrated in FIG. 5(c), the selenium vapor pressure in the vicinity of the specimen can be controlled so as not to exceed the selenium vapor pressure corresponding to the temperature of the specimen due to the evaporation of the element selenium.

Accordingly, during the heating of the specimen after the loading, the vapor pressure is maintained to be as high as possible in the range where the liquefied selenium is not condensed on the specimen which is colder than the outer wall, and after the selenium is completely evaporated, the selenium vapor pressure is maintained to be as high as possible in the range where the selenium is not saturated at the CIGS formation temperature.

Subsequently, it is important to adjust the amount of selenium. In other words, if the amount of selenium to be inserted into the sealed chamber is too large, the liquefied selenium may occur on the specimen during the thermal treatment, and if the amount of selenium is insufficient, the pressure of the sealed chamber cannot be maintained to be the vapor pressure corresponding to the temperature of the outer wall. Therefore, the amount of selenium to be inserted into the sealed chamber needs to be adjusted so that, when all the selenium is evaporated, by considering the amount of selenium to be absorbed into the light absorbing layer, the pressure become as close as possible to the vapor pressure corresponding to the temperature of the outer wall.

As factors for determining the optimum amount of selenium to be inserted, there are a volume of the light absorbing layer to be in the reaction, the size of the chamber, the temperature of the outer wall, and the like. For example, the sum of the amount of selenium which is to be absorbed into the specimen having a size of 100 mm×100 mm where copper of 0.1 μm, indium of 0.173 μm, and gallium of 0.038 μm are deposited, and the maximum insertable amount selenium in the case where the temperature of the outer wall of a 0.3-liter chamber is maintained to be 813 K is as follows on the condition that the atoms of selenium in forms of $Se_2$ and $Se_8$ coexist.

TABLE 2

| | g/mol | Thickness of Deposited Thin Film (μm) | Specific Gravity (g/cm$^3$) | Weight (g) | mol | mol Ratio |
|---|---|---|---|---|---|---|
| Cu | 78.96 | 0.1 | 8.95 | 0.00896 | $1.41 \times 10^{-4}$ | 1 |
| In | 114.82 | 0.173 | 7.31 | 0.0126 | $1.097 \times 10^{-4}$ | 1 |
| Ga | 69.7 | 0.38 | 5.91 | 0.00224 | $3.2127 \times 10^{-5}$ | |
| Se | 78.96 | 0.46 | 4.81 | 0.0223 | $2.824 \times 10^{-4}$ | 2 |

Referring to Table 2, it can be understood that the amount of selenium to be absorbed into the specimen having a size of 100 mm×100 mm in the monatomic state is 22 mg. When the temperature of the outer wall of the 0.3-liter chamber is maintained to be 813 k, the maximum insertable amount of selenium can be obtained by the following Mathematical Formula 1.

$$PV = nRT$$

10 kpa×0.3 L=$n$×0.082 L×100 kpa/K·mol×813 K $n$=0.00045 mol  [Mathematical Formula 1]

The required amount of selenium is calculated to be 0.00045 mol by Mathematical Formula 1 and is calculated to be about 36 mg by Mathematical Formula 2.

1 mol: 78.96 g=0.00045 mol: $x$g  [Mathematical Formula 2]

The sum of the amount of selenium (22 mg) to be absorbed to be in the reaction in the monatomic state and the amount of selenium (36 mg) corresponding to the vapor pressure corresponding to the temperature of the outer wall when all the selenium is evaporated becomes 58 mg. However, since the atoms of selenium in forms of $Se_2$ and $Se_8$ coexist, the amount of $Se_2$ is 29 mg×2=58 mg, the amount of $Se_8$ is 29 mg×8=232 mg, so that the sum is 58 mg+232 mg=290 mg. Therefore, actually, the total amount of selenium to be inserted into the chamber becomes about 300 mg.

In the analysis described above, a decrease in selenium vapor pressure due to about 22 mg of the selenium used for CIGS formation among 300 mg of the inserted selenium is ignored. If the volume of the hot-in chamber is small and, thus, the amount of the inserted selenium becomes small, or if the thickness of the CIGS light absorbing layer is increased and, thus, the amount of consumed selenium is increased, a decrease in vapor pressure due to the consumption of the selenium may also be considered.

Hereinafter, the embodiments of the present invention will be described.

First Embodiment

Figure 3:
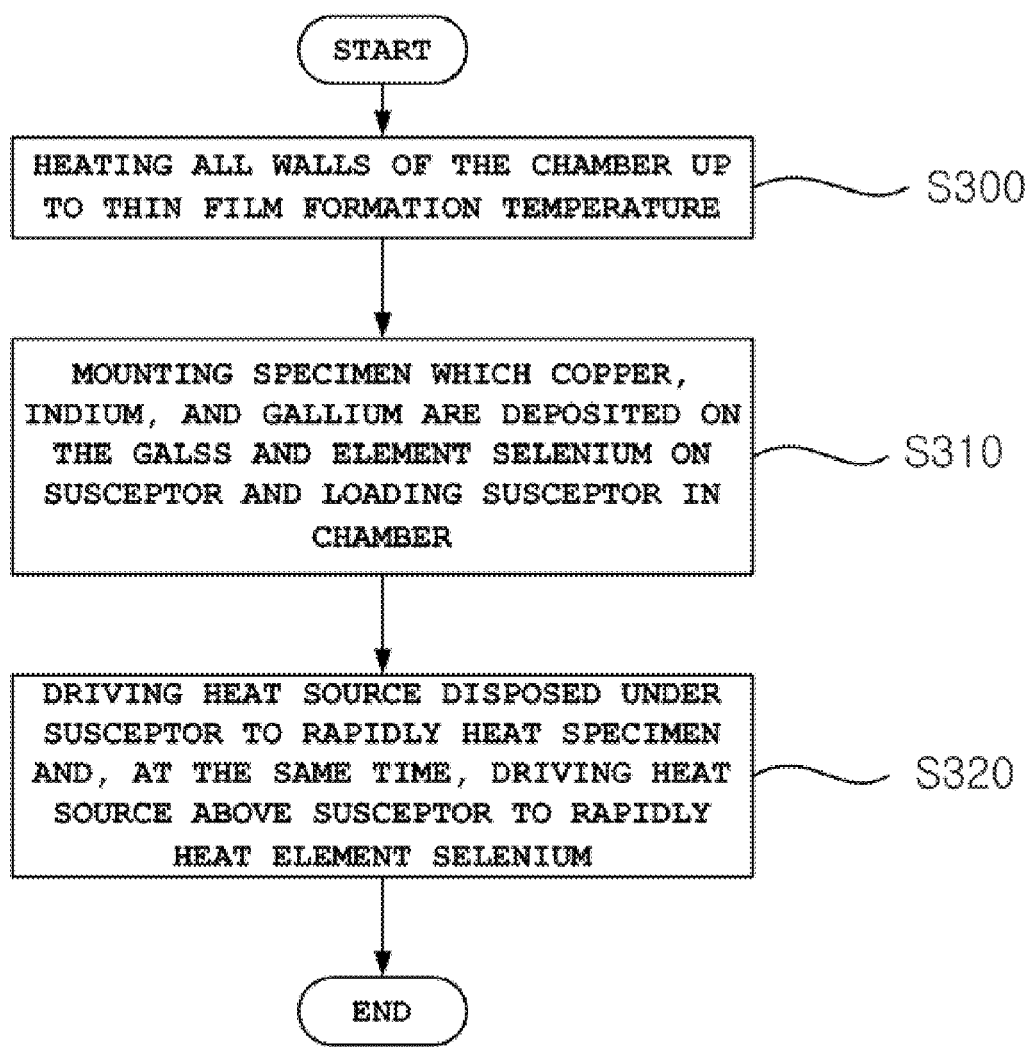
FIG. 3 is a flowchart illustrating a sequence of processes of a method of manufacturing a light absorbing layer for a solar cell according to an exemplary embodiment of the present invention.

FIG. 3 is a flowchart illustrating a sequence of processes of a method of manufacturing a light absorbing layer according to a first embodiment of the present invention. Referring to FIG. 3, the method is configured to include a step (Step 300) of controlling the temperature of all the wall of a sealed chamber to be a predefined thin film formation temperature, a step (Step 310) of loading a specimen where copper, indium, and gallium are laminated and selenium on a susceptor and inserting the susceptor into a chamber, and a step (S320) of heating the specimen by driving a heat source disposed under the susceptor and simultaneously heating element selenium by driving a heat source disposed above the susceptor. In Step 320, in order to allow the selenium not to be condensed on the specimen during the heating process, the temperature of the element selenium is controlled by using the heat source disposed above the susceptor so that the selenium vapor pressure in the vicinity of the specimen does not exceed the vapor pressure corresponding to the temperature of the specimen due to the evaporation of the element selenium. In Step 310, a sufficient amount of selenium is inserted into the chamber in the range which does not exceed the pressure corresponding to the vapor pressure corresponding to the temperature of the outer wall when the selenium is evaporated. In Step 310, in order to sublimate Na functioning as a catalyst for forming high-quality CIGS, to prevent lower precipitation of gallium frequently occurring in the selenization process, and to improve a band gap, one or two of sulfur(S) and a compound containing Na together with the selenium is injected. Preferably, the thin film formation temperature is set to be in a range of 450° C. to 600° C.

Figure 8:
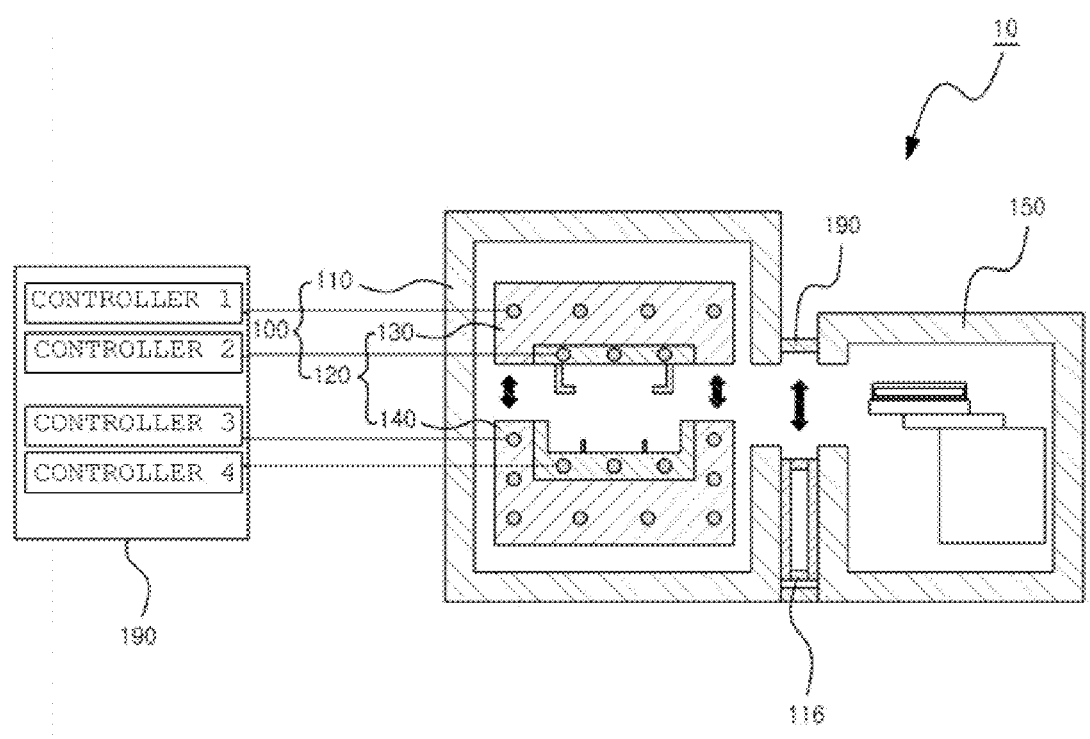
FIG. 8 is a schematic cross-sectional diagram illustrating a thermal treatment apparatus for manufacturing a light absorbing layer for a solar cell according to an exemplary embodiment of the present invention.

FIG. 8 is a cross-sectional diagram illustrating a thermal treatment apparatus for implementing the method of manufacturing a light absorbing layer according to the present invention. Referring to FIG. 8, the thermal treatment apparatus according to the present invention is configured to have a dual-chamber structure including a main chamber and a hot-in chamber and separate heating means for heating a specimen, a susceptor, and an evaporation material. When the selenium and the specimen are heated in the chamber by the thermal treatment apparatus, it is possible to prevent the selenium from being condensed on the wall of the chamber and the surface of the specimen and to provide and maintain a sufficient density of selenium in the chamber.

In the thermal treatment apparatus according to the present invention, the hot-in chamber is configured to include a heating means for individually controlling the temperature of the outer wall of the upper chamber, the temperature of the outer wall of the lower chamber, the temperature of the specimen on the lower layer of the susceptor, and the temperature of the material on the upper layer of the susceptor, so that a sufficiently high selenium vapor pressure of the chamber can be maintained and the element selenium can be controlled so as not to be condensed on the specimen.

In addition, the hot-in chamber of the thermal treatment apparatus is configured to include an upper unit and a lower unit. When one or both of the upper and lower units are driven to be moved in the up/down direction so that the upper and lower units are in contact with each other, the hot-in chamber is in a sealed state. When the upper and lower units are separated from each other, the hot-in chamber is in a state where the susceptor on which the specimen is mounted can be loaded or unloaded. When the susceptor on which the element selenium and the specimen are mounted is to be loaded from a buffer chamber to the hot-in chamber of the main chamber in order to be heated, the completely sealed state and the loaded/unloaded state of the hot-in chamber can be simultaneously provided.

In addition, in the thermal treatment apparatus, a horizontally-driven robot is installed in the buffer chamber connected to a main chamber through a door in cooperation with up/down driving of the hot-in chamber of the main chamber so as to the susceptor on which the specimen is mounted can be loaded in or unloaded from the hot-in chamber of the main chamber without exposure in order to prevent inner and outer portions of the chamber from being contaminated. Accordingly, without direct exposure of the selenium vapor and the like, the susceptor on which the specimen is mounted can be loaded or unloaded.

Figure 6:
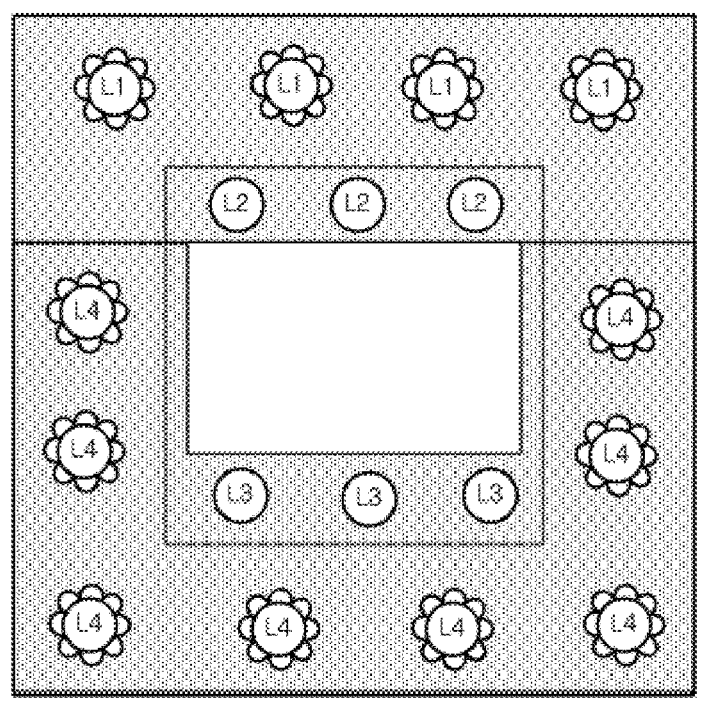
FIG. 6 is a diagram illustrating a state of a hot-in chamber before a specimen is loaded in the manufacturing method according to the exemplary embodiment of the present invention.

FIG. 6 illustrates a state of the hot-in chamber before the specimen is loaded in the manufacturing method according to the exemplary embodiment of the present invention. The hot-in chamber illustrated in FIG. 6 is the hot-in chamber heated in Step 300. Referring to FIG. 6, in order to maintain the selenium vapor pressure to be as high as possible by preventing the selenium from being condensed on all the wall of the sealed chamber during the heating after the specimen is loaded, a first heat source L1 for controlling the temperature of the entire area of the upper unit and a fourth heat source L4 for controlling the temperature of the entire area of the lower unit are used so as to heat all the inner and outer wall of the hot-in chamber up to a temperature near the CIGS formation temperature of 550° C. and maintain the temperature in advance. Each of the upper and lower units is constructed with graphite and quartz glass. The upper unit and the lower unit are driven in up/down direction so as to open or close the second chamber. FIG. 6 illustrate temperature distribution of the second chamber before the susceptor is loaded in a state where the heat sources L1 and L4 are turned on and the heat sources L2 and L3 are turned off. As illustrated in FIG. 6, the upper and lower units constituting the wall of the chamber are heated up to 550° C. The heat source L2 is used for rapidly heating the element selenium up to a temperature near the CIGS formation temperature. In the above state, the heat source L2 is turned off. The heat source L3 is a heat source for rapidly heating the specimen up to a temperature near the CIGS formation temperature. In order to prevent liquefied selenium from occurring on the surface of the specimen, the heat source L3 is used to control the temperature of the specimen so that the selenium vapor pressure corresponding to the temperature of the specimen is higher than the selenium vapor pressure in the vicinity of the specimen due to the evaporation of the element selenium. In the above state, the heat source L3 is turned off.

Figure 7:
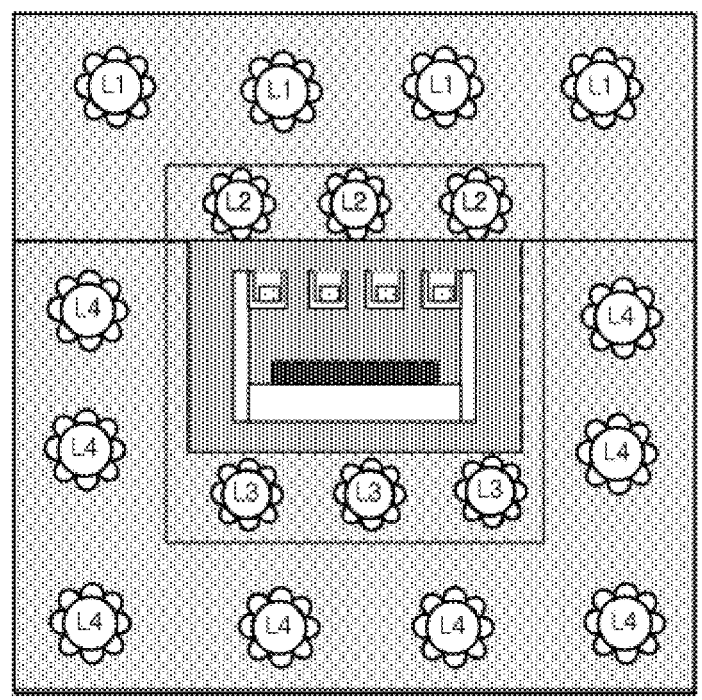
FIG. 7 is a diagram illustrating a state of a hot-in chamber after a specimen is loaded in the manufacturing method according to the exemplary embodiment of the present invention.

FIG. 7 is a diagram illustrating a state of a hot-in chamber after a specimen is loaded in the manufacturing method according to the exemplary embodiment of the present invention. FIG. 7 illustrates Step 310 and Step 320. Referring to FIG. 7, first, the susceptor on which the specimen is mounted is loaded in the chamber of which the temperature of the wall is maintained to be a temperature near the CIGS formation temperature. Next, the second heat source is controlled to heat the element selenium loaded in the chamber up to the temperature near the CIGS formation temperature so that the liquefied selenium is not condensed on the specimen which is loaded in the chamber at the room temperature and is not yet heat, and the third source is controlled to heat the specimen up to the temperature near the CIGS formation temperature so that the saturation vapor pressure corresponding to the temperature of the specimen is higher than the is higher than the selenium vapor pressure in the vicinity of the specimen due to the evaporation of the element selenium in order to prevent the liquefied selenium from being condensed on the surface of the specimen. Therefore, the selenium vapor pressure in the vicinity of the specimen due to the evaporation of the element selenium does not exceed the vapor pressure corresponding to the temperature of the specimen. According to the method, the selenium is prevented from being condensed on all the wall of the sealed chamber, so that the selenium vapor pressure of the chamber is maintained as high as possible. In addition, during the heating of the specimen after the loading, the vapor pressure is maintained as high as possible in a range where the liquefied selenium is not condensed on the specimen which is cooler than the outer wall, so that a light absorbing layer having a high quality can be obtained.

As illustrated in FIG. 7, after the loading of the susceptor, all the heat sources L1, L2, L3, and L4 are turned on to perform rapid heating, so that the temperature of the wall of the chamber is maintained to be 550° C. and the temperature of the susceptor is maintained to be in a range of 500° C. to 550° C.

On the other hand, since it is difficult to supply a sufficient amount of Na during the selenization process and lower precipitation of gallium occurs, there is a limitation in improving the characteristics of the light absorbing layer. In order to solve the problem, in the exemplary embodiment of the present invention, the specimen on which copper, indium, and gallium are deposited is inserted into a hot-in chamber of which the sealed outer wall is heated up to a temperature near the CIGS formation temperature, and at the same time, the selenium and one or two of sulfur(S) and a compound containing Na for selenization are separately inserted. After that, the specimen and the source materials are heated by the heat source such as a halogen lamp, so that the CIGS light absorbing layer is manufactured. In this manner, during the selenization process, the element selenium and one or two of sulfur (S) and a compound containing Na are injected into the specimen, so that Na functioning as a catalyst in the formation of high-quality CIGS can be sublimated. In addition, the lower precipitation of gallium which frequently occurs during the selenization process can be prevented, and the band gap can be improved, so that high-efficiency α-phase can be easily obtained.

On the other hand, in the case where element selenium is distributed around the specimen and, after that, heating is performed according to the method in the related art, according to the size of the specimen, the middle region of the specimen is away from the selenium, and the outer region of the specimen is close to the selenium, so that there are problems in that it is difficult to allow the selenium to uniformly react with the entire specimen and an evaporation amount cannot be controlled. In order to solve this problem, in the manufacturing method according to the present invention, a susceptor having a new structure is provided. The susceptor having a new structure according to the present invention is configured to include a lower mounting plate on which the specimen can be mounted and an upper mounting plate on which the selenium and one or two of sulfur(S) and a compound containing Na are mounted, wherein the upper mounting plate is disposed to be separated by a certain distance from the lower mounting plate. The upper mounting plate is configured to include holes for securing fluidity of an evaporated gas of the materials when the specimen and the materials mounted on the susceptor are simultaneously heated by the heat source such as a halogen lamp and depressed portions on which the materials are mounted so that the evaporation amount can be controlled in terms of structure.

In the susceptor according to the present invention, due to the holes in terms of structure, the selenium and the materials such as one or two of sulfur(S) and a compound containing Na can be uniformly evaporated irrespective of the size of the specimen. In addition, since the vapor pressure is a function of temperature and the evaporation amount is proportional to a product of the exposed area of the source material and the vapor pressure, the temperature of the specimen can be controlled. If the size of the depressed portions of the susceptor on which the source material is mounted is well defined, the quantification is available, and the evaporation amount can be controlled.

In the related art, there is the problem in that, when the element selenium and the specimen are heated in the chamber, the selenium is condensed on the wall of the chamber or on the specimen, so that a sufficient density of the selenium in the chamber cannot be maintained. In order to solve the problem, the thermal treatment apparatus according to the present invention has a dual chamber structure including the main chamber and the hot-in-chamber disposed inside the main chamber under vacuum or $N_2$ ambience, so that the temperature of the outer wall of the hot-in chamber is controlled up to a temperature near the CIGS formation temperature and the loaded specimen, the susceptor, and the evaporation materials are heated by separate means.

Hereinafter, a structure and operations of the thermal treatment apparatus for manufacturing a light absorbing layer for a solar cell which can be used for the method of manufacturing the light absorbing layer for the solar cell according to the above-described exemplary embodiment of the present invention will be described with reference to the attached drawings. Referring to FIG. 8, the thermal treatment apparatus 10 is configured to include a main chamber 100 and a buffer chamber 150, and the main chamber and the buffer chamber are connected to each other through a connection passage 190.

The main chamber 100 according to the exemplary embodiment of the present invention is configured to have a dual-chamber structure including a first chamber 110 and a second chamber 120 disposed inside the first chamber. The first chamber is configured to include a vacuum valve 112 for forming vacuum in the first chamber and a gas injection valve 114 for injecting a gas into the first chamber. A first hole is formed on one side surface of the first chamber to be fitted to the connection passage for connecting to the buffer chamber.

Referring to FIG. 8, in addition to the main chamber 100 and the buffer chamber 150, the thermal treatment apparatus 10 according to the exemplary embodiment of the present invention is configured to further include a control module 190. In the connection passage 190 which connects the main chamber and the buffer chamber, a door 116 capable of being opened and closed in up/down or left/right direction is installed so as to connect the main chamber and the buffer chamber or to separate the main chamber and the buffer chamber from each other. In this manner, since the buffer chamber connected to the main chamber is further included, it is possible to improve a sealing function of the main chamber, to maintain a vacuum state of the main chamber, and to easily maintain the temperature. The control module 190 controls overall operations of the buffer chamber and the main chamber according to a pre-defined program and, particularly, controls the driving of the heat sources of the main chamber so as to optimize the selenization process for forming the light absorbing layer for a solar cell.

The second chamber 120 is a hot-in-chamber configured to include an upper unit 130 and a lower unit 140. The second chamber 120 is configured so that the lower surface of the upper unit and the upper surface of the lower unit can be allowed to be coupled with each other, and in the coupled state, a sealed space functioning as a substantially chamber is formed between the upper unit and the lower unit.

The upper unit 130 is configured to an upper main body 132, a first heat source L1 which is installed inside the upper main body to heat the upper main body, a first susceptor placing unit 136 which is fixed to a lower portion of the upper main body 132, and a second heat source L2 which is installed inside the first susceptor placing unit to heat the first susceptor placing unit. The lower unit 140 is configured to a lower main body 142, a fourth heat source L4 which is installed inside the lower main body to heat the lower main body, a second susceptor placing unit 146 which is formed on an upper portion of the lower main body, and a third heat source L3 which is installed inside the second susceptor placing unit to heat the second susceptor placing unit.

The upper main body 132 is made of a graphite material, and the first heat source L1 including a plurality of heat sources is installed inside the upper main body 132. When the first heat source is driven, the upper main body 132 of the second chamber is heated. The first susceptor placing unit 136 is made of a quartz glass. The first susceptor placing unit 136 is installed on the lower surface of the upper main body 132 and is configured to include a susceptor mounting plate 133 on the surface thereof facing the second susceptor placing unit of the lower unit, so that the susceptor on which a source material or a specimen is mounted can be placed. The second heat source L2 including a plurality of heat sources are installed inside the first susceptor placing unit installed on the lower surface of the upper main body. In the above-described structure, when the susceptor is mounted on the susceptor mounting plate 133 of the first susceptor placing unit, the second heat source is driven to heat the upper portion of the susceptor.

Similarly to the upper main body 132, the lower main body 142 is made of a graphite material, and the fourth heat source L4 including a plurality of heat sources is installed inside the lower main body 142. The second susceptor placing unit 146 is made of a quartz glass. The second susceptor placing unit 146 is installed on the upper surface of the lower main body, and a recess portion 'b' is formed at the position facing the susceptor mounting plate of the first susceptor placing unit. When the first susceptor placing unit of the upper unit and the second susceptor placing unit of the lower unit are in contact with each other, the specimen mounting plate is placed on the recess portion, and a sealed space is formed due to the contact between the recess portion and the susceptor mounting plate. The third heat source L3 including a plurality of heat sources are installed inside the second susceptor placing unit installed on the upper surface of the lower main body. Protrusions 149 are formed on the surface of the recess portion of the second susceptor placing unit 146. When the susceptor or the specimen is mounted on the susceptor mounting plate of the first susceptor placing unit, due to the protrusions, the susceptor or the specimen is not in direct contact with the surface of the recess portion of the second susceptor placing unit.

Figure 9:
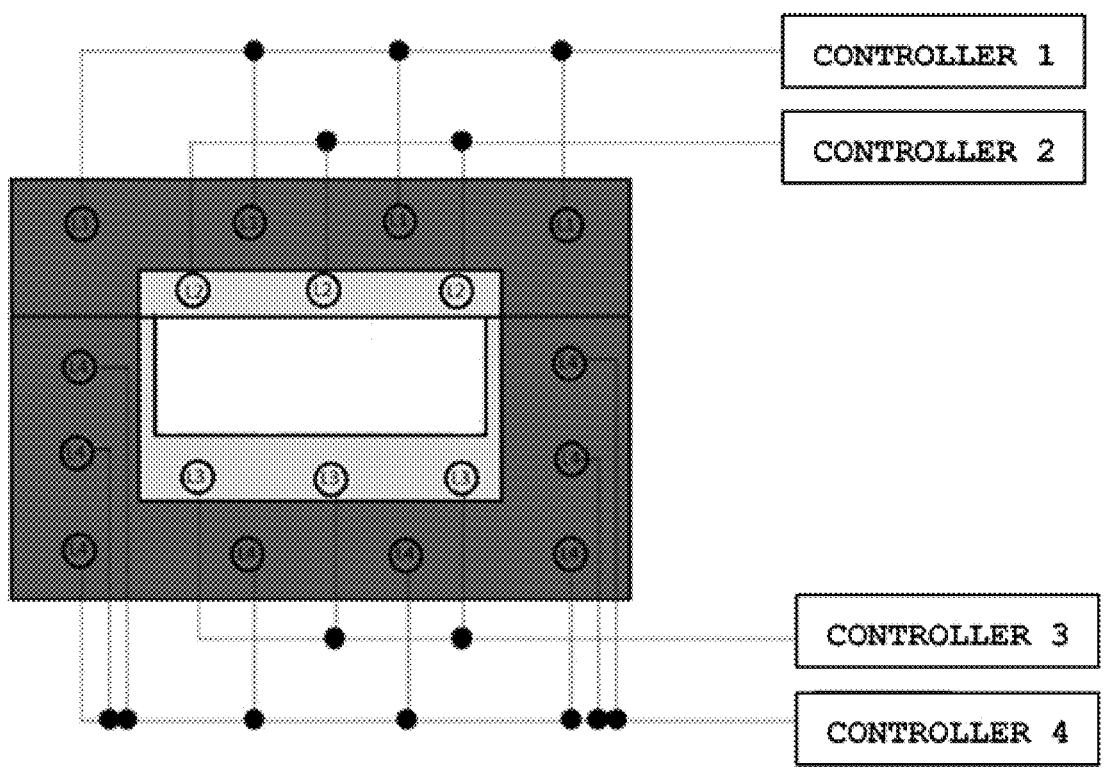
FIG. 9 is a cross-sectional diagram illustrating control modules connected to heat sources in a second chamber of the thermal treatment apparatus illustrated in FIG. 8.
Figure 10:
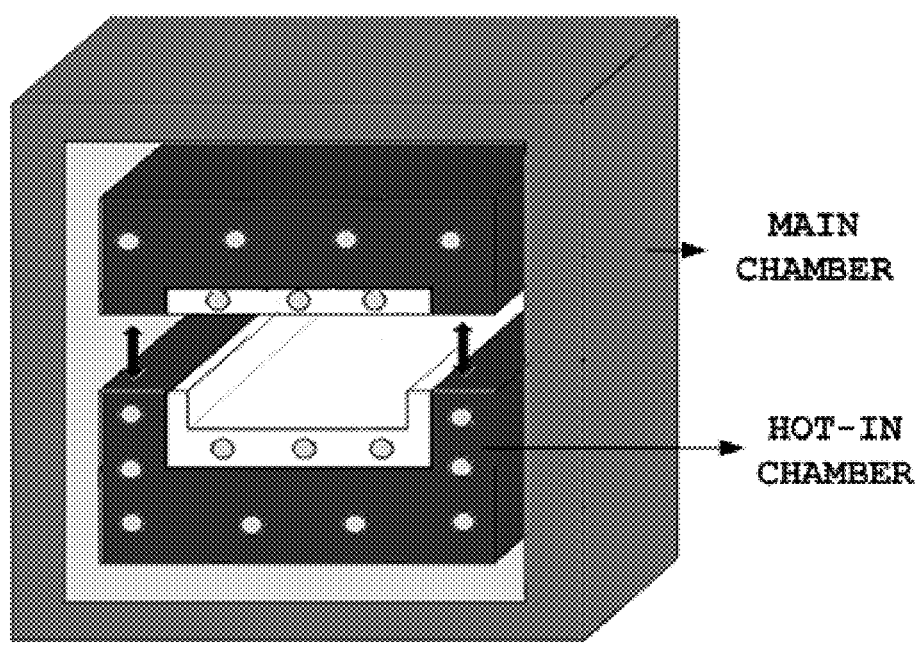
FIG. 10 is a perspective diagram illustrating a main chamber of the thermal treatment apparatus illustrated in FIG. 8.

As illustrated in FIG. 9, the first heat source L1, the second heat source L2, the third heat source L3, and the fourth heat source L4 are connected to controllers 1, 2, 3, and 4 disposed outside the first chamber, so that the first to fourth heat sources can be controlled to be individually driven by the corresponding controllers. The first heat source is driven to heat the upper main body, the fourth heat source is driven to heat the lower main body, and the second and third heat sources are driven to heat the susceptor on which the source material or the specimen is mounted. The control module 190 includes the controllers 1, 2, 3, and 4. As illustrated in FIG. 9, the controller 1 allows the first heat source L1 to heat the upper main body of the upper unit so as to control the temperature of the wall of the chamber of the upper unit of the second chamber. The controller 2 allows the second heat source L2 to heat the susceptor so as to control the temperature of the source material on the upper layer of the susceptor. The controller 3 allows the third heat source L3 to heat the susceptor so as to control the temperature of the specimen on the lower layer of the susceptor. The controller 4 allows the fourth heat source L4 to heat the lower main body of the lower unit so as to control the temperature of the wall of the chamber of the lower unit of the second chamber.

In the thermal treatment apparatus according to the embodiment, the first susceptor placing unit of the upper main body and the second susceptor placing unit of the lower main body are arranged to face each other, and the upper main body and the lower main body are configured so that the one thereof is fixed and the other is moveable in the up/down direction. Therefore, the other one of the upper and lower main bodies which is moveable in the up/down direction is connected to a linear motor guide so as to be moved along the linear motor guide by using a motor. In another embodiment of the present invention, both of the upper and lower unit bodies may be configured to be moveable in the up/down direction.

Figure 11:
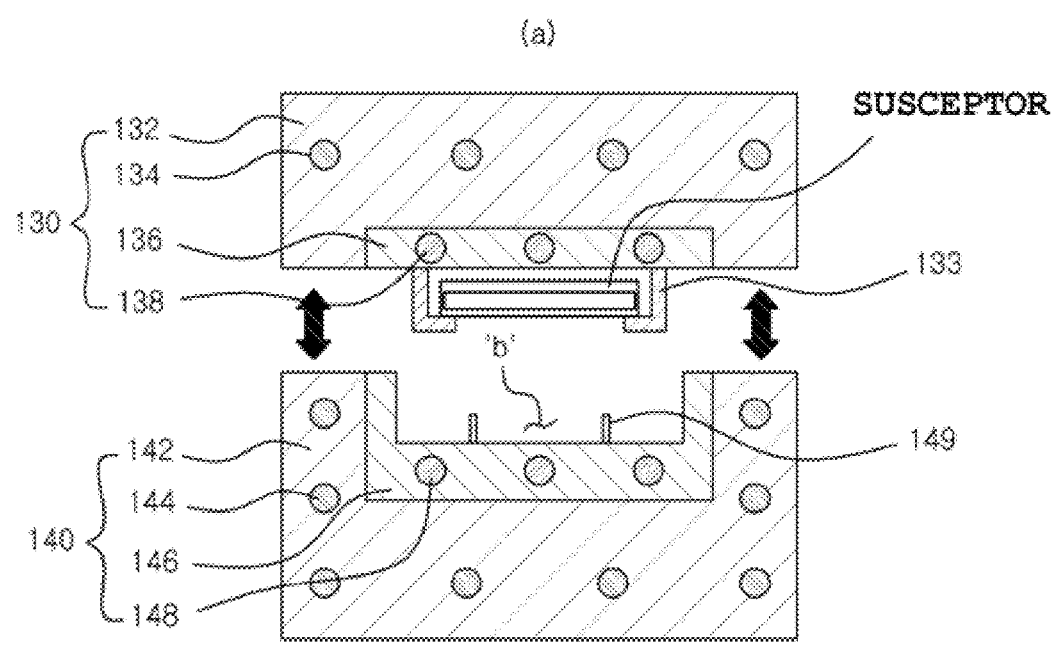
FIG. 11 are cross-sectional diagrams illustrating states where a susceptor is loaded in the second chamber of the thermal treatment apparatus according to an exemplary embodiment of the present invention, (a) illustrates a state where an upper unit and a lower unit are separated from each other, and (b) illustrates a state where the susceptor is loaded and the upper unit and the lower unit are coupled with each other.
Figure 11:
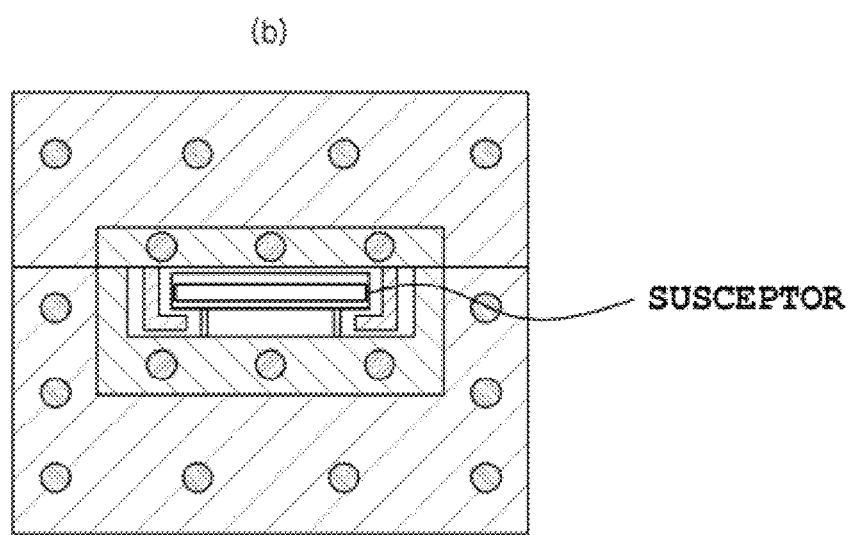

FIGS. 11(a) and 11(b) are cross-sectional diagram illustrating states where a susceptor is loaded in the second chamber of the thermal treatment apparatus according to an exemplary embodiment of the present invention, FIG. 11(a) illustrates a state where an upper unit and a lower unit are separated from each other, and FIG. 11(b) illustrates a state where the susceptor is loaded and the upper unit and the lower unit are coupled with each other.

In this manner, since the thermal treatment apparatus according to the exemplary embodiment of the present invention is configured to have the dual-chamber structure including the first and second chambers, before the specimen or the susceptor to be thermally treated is loaded in the chamber, the wall of the second chamber is heated, so that a temperature defined in advance can be continuously maintained to be constant. In addition, since the thermal treatment apparatus is configured to have the dual-chamber structure, it is possible to more efficiently control the sealed, vacuum state of the second chamber installed inside.

In addition, the thermal treatment apparatus according to the exemplary embodiment of the present invention is configured to further include a buffer chamber connected to the main chamber. After the susceptor is mounted in the buffer chamber, the buffer chamber and the main chamber are isolated from the exterior. Next, the susceptor is loaded from the buffer chamber into the main chamber by using the robot arm, or the susceptor is unloaded from the main chamber. Therefore, it is possible to prevent the main chamber to be contaminated due to injection of an external air and to easily maintain vacuum of the main chamber.

Figure 12:
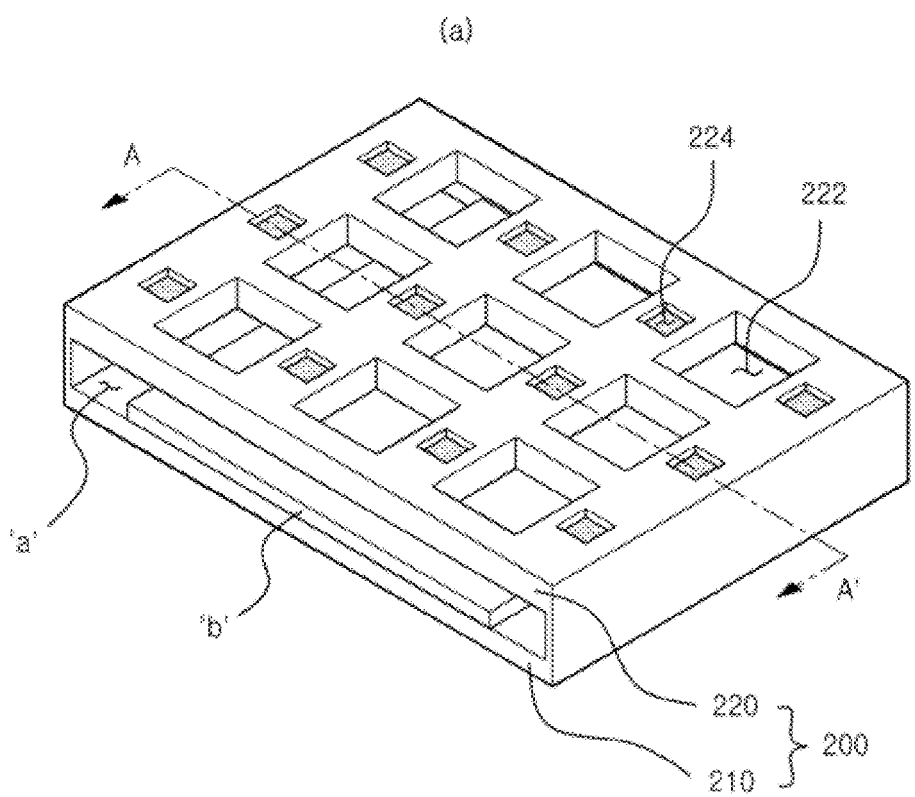
FIG. 12 are a diagrams illustrating (a) an example of a structure of a susceptor used in the method according to the present invention, and (b) is a cross-sectional diagram taken along line A-A of (a).
Figure 12:
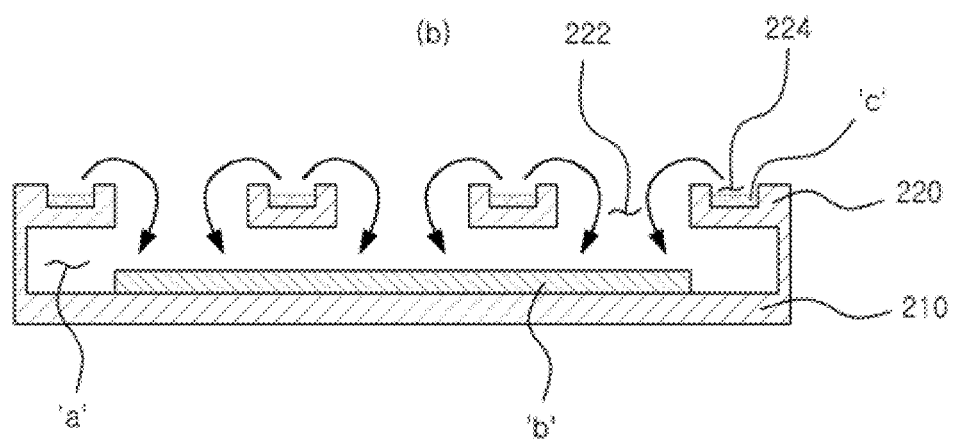

FIGS. 12(a) and 12(b) illustrates an example of the susceptor used for the thermal treatment apparatus according to the exemplary embodiment of the present invention. As illustrated in FIGS. 12(a) and 12(b), a specimen is mounted on the specimen mounting plate of the susceptor, and source material s, that is, materials to be injected into the specimen are mounted on depressed portions of the source material mounting plate. At this time, in the selenization process according to the present invention, the selenium and one or two of sulfur (S) and a compound containing Na are mounted on the depressed portions of the source material mounting plate. The mounted amount thereof may be determined according to a size of the specimen, a size of the chamber, a temperature of the outer wall, and the like. The size of the depressed portion may be determined according to a desired evaporation amount of the mounted source materials such as selenium.

According to the susceptor having the above-described structure, during the heating, the source materials which are mounted on the depressed portions of the source material mounting plate of the susceptor are evaporated or gasified to be dispersed from the depressed portions. The dispersed source materials pass through the adjacent holes to be deposited on the surface of the specimen which is mounted on the lower specimen mounting plate. In this case, since the depressed portions and the holes are arranged uniformly and are separated by a uniform distance from the surface of the specimen, the source materials can be uniformly supplied to the specimen to be deposed on the surface of the specimen. As a result, the deposition process can be uniformly performed on the surface of the specimen.

Figure 13:
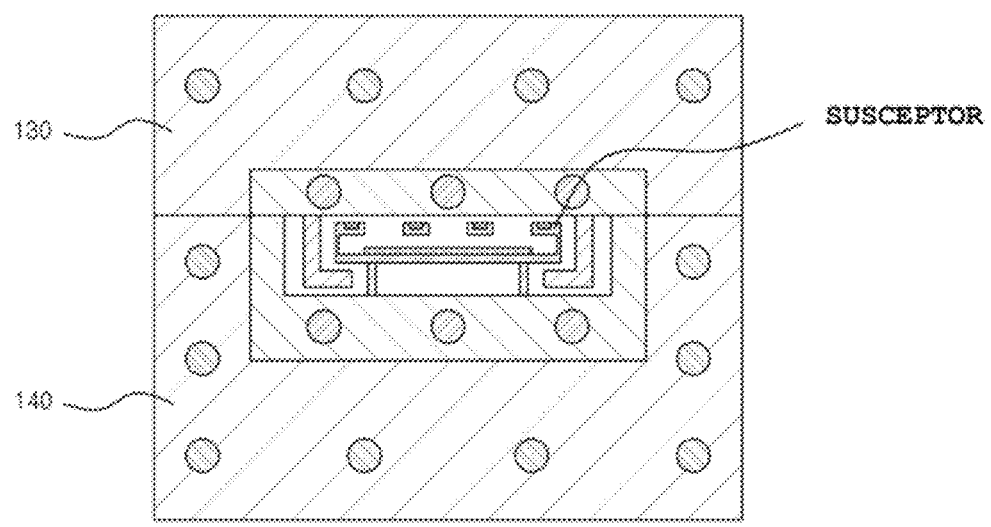
FIG. 13 is a diagram illustrating an example of a state where a control module of a thermal treatment apparatus according to an embodiment of the present invention performs thermal treatment after a susceptor is loaded on a second chamber of a main chamber.

FIG. 13 is a diagram illustrating an example of a state where a control module of a thermal treatment apparatus according to the embodiment of the present invention performs thermal treatment after the susceptor is inserted into the second chamber of the main chamber. Referring to FIG. 13, when the susceptor is loaded in the second chamber of the main chamber, the control module individually drives the first heat source installed in the upper main body of the upper unit and the fourth heat source installed in the lower main body of the lower unit to heat the wall of the second chamber constructed with the upper and lower main bodies up to a pre-defined thin film formation temperature. When the temperature of the wall of the second chamber is increased up to the thin film formation temperature, the third heat source is driven to heat the lower portion of the second susceptor placing unit where the susceptor is placed, so that the specimen mounted on the specimen mounting plate in the lower portion of the susceptor is heated. In addition, the second heat source is driven to the upper portion of the first susceptor placing unit, so that the source materials mounted on the source material mounting plate in the upper portion of the susceptor are heated. At this time, while the temperature of the specimen is maintained to be higher than or equal to the temperature of the inner portion of the chamber to be lower than the temperature of melting or deforming of the substrate of the specimen, the selenization process is performed by performing thermally treatment on the specimen and the source material.

In this manner, in the thermal treatment apparatus according to the exemplary embodiment of the present invention, the wall of the chamber, the inner upper space of the chamber, and the inner lower space of the chamber can be individually heated.

Hereinafter, a sequence of processes of a method of manufacturing a light absorbing layer for a solar cell by using thermal treatment apparatus according to the exemplary embodiment of the present invention will be described.

First, a specimen is mounted on the first mounting plate of the susceptor. At this time, the specimen is in a state where Cu, In, and Ga in precursor forms are deposited on Mo of a glass substrate in a previous process. The specimen is a specimen in the pre-step of the selenization process.

Next, source materials which are to be injected into the specimen are mounted on the second mounting plate, and after that, the second mounting plate is loaded on the horizontally-driven robot of the buffer chamber. At the time, the materials including the selenium and one or two of sulfur(S) and a compound containing Na are simultaneously mounted. Particularly, a sufficient amount of selenium is mounted so that the selenium vapor pressure of the complete evaporation can be near to the vapor pressure corresponding to the temperature of the outer wall. Next, the susceptor is moved from the buffer chamber to a specimen holding portion of the upper unit of the second chamber by using the horizontally-driven robot of the buffer chamber. When the susceptor is loaded in the second chamber, the upper unit or the lower unit is moved to be engaged with each other, so that the space where the specimen or the susceptor is loaded is sealed by the upper unit and the lower unit. The heat sources installed inside the upper unit and the lower unit and above and under the susceptor are individually controlled, so that the specimen and the materials on the susceptor are thermally treated.

Hereinafter, a specific method of generating a light absorbing layer through the above-described thermal treatment process and supplying selenium vapor after the element selenium and the specimen are simultaneously annealed will be described. The profile of the temperature of the specimen is illustrated in FIG. 5(b). The temperature of the upper unit and the temperature of the lower unit are controlled at a temperature near the target temperature of the specimen, that is, in a range of 400° C. to 600° C. If the temperatures of the inner and outer wall of the chamber are not controlled nor sufficiently controlled so that a sufficiently high selenium vapor pressure cannot be maintained, the selenium is condensed on the associated portion. Therefore, although a large amount of selenium is supplied, the selenium vapor ambience of about $1/100$ atm to about $1/10$ atm or more, which is the vapor pressure corresponding to the temperature range of 400° C. to 600° C., cannot be maintained. Therefore, it is important that all the inner portions of the sealed chamber are maintained a uniform temperature near the specimen target temperature. Therefore, after the outer wall is heated in advance, the heat source such as a halogen lamp disposed under the susceptor is driven to heat the specimen, and at the same time, the heat source such as a halogen lamp disposed above the susceptor is driven to heat the element selenium and one or two of sulfur (S) and a compound containing Na up to the specimen target temperature.

As described above, the condensation of the selenium on the specimen may cause the problems of surface tension due to viscosity of liquefied selenium, non-uniform evaporation due to inevitable non-uniformity of temperature, damage to molybdenum electrode due to diffusion of liquefied selenium into a molybdenum electrode, and the like. Therefore, in order to prevent the liquefied selenium from being condensed on the specimen during the process, the intensity of the heat source such as a halogen lamp disposed above the susceptor is controlled so that the selenium vapor pressure of the chamber due to the evaporation of the element selenium is increased to be slightly lower than the vapor pressure corresponding to the temperature of the substrate.

Second Embodiment

Hereinafter, a sequence of processes of a method of forming the CIGS thin film on the substrate by using the manufacturing method according to the present invention will be described. The method of manufacturing the CIGS solar cell is configured to include a step of forming a back-side electrode layer on a soda lime glass (soda lime glass) substrate which is rinsed by RCA, a step of forming a light absorbing layer, a step of forming a buffer layer, a step of forming an I—ZnO layer, a step of forming a window layer, a step of forming an anti-reflection layer, and a step of forming a grid electrode layer and performing electrode wiring.

More specifically, in the method of manufacturing the CIGS solar cell, the substrate is formed with a thickness of 1 mm to 3 mm by using a soda lime glass. After the substrate is prepared, the substrate is rinsed through an RCA rinsing method by using deionized (DI) water. Besides the soda lime glass, a ceramic substrate such as alumina, a metal substrate such as stainless steel or copper, a polymer substrate, and the like may be used as the substrate.

After the rinsing of the substrate, the step of forming the back-side electrode layer is performed. The back-side electrode layer is formed by using molybdenum which has low specific resistance as an electrode and has no peeling phenomenon due to a difference in thermal expansion coefficient and excellent adhesiveness with respect to the glass substrate. In the embodiment, the back-side electrode layer is formed with a thickness of 0.5 µm to 1 µm by using molybdenum on the substrate through a DC sputtering method.

After the forming of the back-side electrode layer, the step of forming the light absorbing layer is performed. A compound semiconductor which contains copper, indium, gallium, and selenium and has the best energy conversion efficiency of the solar cell is used as the light absorbing layer. Next, a CIG film is deposited by sputtering a Cu0.7-Ga0.3 alloy target and an indium target. After the element selenium and the specimen are heated in the hot-in chamber, the light absorbing layer is formed on the back-side electrode layer by supplying the selenium vapor. Herein, the thickness of the light absorbing layer is about 1 µm.

After the step of forming the light absorbing layer on an upper portion of the back-side electrode layer, a step of forming a buffer layer on an upper portion of the light absorbing layer is performed. The buffer layer is used to adhere a P-type semiconductor disposed under the buffer layer and an N-type semiconductor above the buffer layer. Cadmium sulfide (CdS) is used for the buffer layer. The layer of cadmium sulfide is formed with a thickness of 0.05 µm through a chemical bath deposition (CBD) method. After the step of forming the buffer layer, a step of forming an I-ZNO layer on an upper portion of the buffer layer is performed. The I-ZNO layer is a high-resistance thin film functioning as preventing an electrical short circuit between the back-side layers and the TCO layer. The I-ZNO layer is formed with a thickness of 0.05 µm through an RF sputtering method. After the step of forming the I-ZNO layer on an upper portion of the buffer layer, a step of forming a window layer on an upper portion of the I-ZNO layer is performed. The window layer is an n-type semiconductor layer functioning as a transparent electrode on the front side of the solar cell. The window layer is formed by using AZO having high light transmittance and a high electrical conductivity. More specifically, the window layer is formed with a thickness of 0.46 to 0.6 µm through an RF sputtering method. After the step of forming the window layer, a step of forming an anti-reflection layer on an upper portion of the window layer is performed. The anti-reflection layer has a function of reducing reflection loss of solar light incident on the solar cell. The anti-reflection layer is formed by using magnesium fluoride ($MgF_2$). In the embodiment, the anti-reflection layer is formed by evaporating magnesium fluoride as a source material and injecting the evaporated gas on the upper surface of the window layer through an evaporation deposition method. The anti-reflection layer is formed with a thickness of 0.08 to 0.12 µm.

After the anti-reflection layer is formed, a step of forming a grid electrode layer and a step of wring electrodes are performed. More specifically, a grid electrode layer has a function of collecting current on a surface of the solar cell. The grid electrode layer is formed by using aluminum. The grid electrode layer is formed with a thickness of 3 µm by using aluminum through an evaporation deposition method. Herein, as a material for the grid electrode layer, Ni/Al may be instead of aluminum. After the grid electrode is formed, the grid electrode and the back-side electrode layer are connected through a wire, and load is applied between the two electrodes. While light is irradiated, the efficiency is measured. In this manner, the manufacturing of the solar cell is completed.

The efficiency of the CIGS solar cell obtained by using the method according to the embodiment is 15%. More specifically, the Voc is 670 mV, the Isc is 32 mA, and the fill factor 70%.

Third Embodiment

In the method of the related art, there is a problem in that lower precipitation of gallium occurs during the selenization process, so that the efficiency is decreased. In order to solve the problem, one or two of sulfur(S) and a compound containing Na and the selenium are injected during the selenization process to sublimate Na functioning as a catalyst for forming high-quality CIGS, to prevent lower precipitation of gallium, and to improve the band gap. In this manner, during the selenization process, the selenium and one or two of sulfur(S) and a compound containing Na are injected, so that it is possible to generate a high-quality CIGS light absorbing layer.

While the present invention has been particularly shown and described with reference to exemplary embodiments thereof, it will be understood by those skilled in the art that various changes in form and details may be made therein without departing from the spirit and scope of the invention as defined by the appended claims. The drawings and examples used in the embodiments hereinbefore are provided for the better understanding of the present invention. Particularly, as the heat sources for controlling and the temperature of the specimen and the vapor pressure of the materials, a halogen lamp is exemplified in the specification. However, radiation heat of the wall of the chamber can be used to heat the specimen and the materials, so that the selenium vapor pressure can be controlled to be equal to or lower than the vapor pressure corresponding to the temperature of the specimen according to the states of the chamber and the susceptor. This change should be construed as being included within the scope of the invention.

According to the present invention, it is possible to provide a method of manufacturing a high efficiency CIGS light absorbing layer through processes of depositing a CIG/CI thin film on an electrode and performing thermal treatment in an element selenium vapor ambience, and it is possible to provide a technical solution for reducing production cost of the CIGS light absorbing layer, obtaining high productivity and convenience in manufacturing processes, and easily implementing high area, so that the CIGS solar cells can be successfully commercialized through the method.

In addition, according to the present invention, a thermal treatment apparatus is configured to have a dual-chamber structure, and a temperature of the chamber and a temperature of a specimen can be individually controlled, so that the thermal treatment apparatus can be widely used for a selenization process of a method of manufacturing a CIGS solar cell formed on a glass substrate.

What is claimed are:

1. A method of manufacturing a light absorbing layer for a solar cell by performing thermal treatment on a specimen configured to include thin films of at least one or more of copper, indium, and gallium on a substrate and a source material including element selenium, comprising steps of:
   (a) heating wall of a chamber up to a pre-defined thin film formation temperature;
   (b) mounting a source material including the element selenium and the specimen on a susceptor at the room temperature and loading the susceptor on which the source material and the specimen are mounted in the chamber of which wall is heated; and
   (c) while controlling a temperature of the source material including the element selenium inserted into the chamber and a temperature of the specimen, performing thermal treatment on the specimen and the element selenium on the susceptor up to the thin film formation temperature,
   wherein, in the step (c), during the thermal treatment, the temperature of the element selenium and the temperature of the specimen are individually controlled so that the selenium is not condensed on the specimen.

2. The method according to claim 1, wherein, in the step (c), the temperature of the element selenium and the temperature of the specimen are individually controlled so that the selenium vapor pressure of the chamber due to the evaporation of the element selenium does not exceed saturation pressure corresponding to the temperature of the specimen.

3. The method according to claim 1,
   wherein the susceptor is configured to include a specimen mounting plate on which the specimen is mounted and a source material mounting plate on which the source material is mounted,
   wherein the source material mounting plate of the susceptor is fixed to the upper portion of the specimen mounting plate, and
   wherein, in the source material mounting plate, a plurality of holes penetrating upper and lower surfaces of the source material mounting plate and a plurality of depressed portions for mounting the source material on the upper surface of the source material mounting plate are uniformly arranged, so that the source material is uniformly supplied to the surface of the specimen during the thermal treatment process.

4. The method according to claim 1, wherein, in the step (c), the temperature of the wall of the chamber is controlled so that the selenium is not condensed on an inner wall of the chamber during the thermal treatment.

5. The method according to claim 1, wherein the source material further contains one or two of sulfur (S) and a compound containing Na in addition to the element selenium.

* * * * *